United States Patent
Matsunaga et al.

[11] Patent Number: 6,150,861
[45] Date of Patent: Nov. 21, 2000

[54] FLIP-FLOP

[75] Inventors: Toshichika Matsunaga, Chiba; Hiroyuki Nishimura, Kanagawa, both of Japan

[73] Assignee: Texas Instruments Incorporated, Dallas, Tex.

[21] Appl. No.: 09/211,945

[22] Filed: Dec. 15, 1998

Related U.S. Application Data

[60] Provisional application No. 60/072,457, Jan. 9, 1998.

[51] Int. Cl.$^7$ .............................. H03K 5/13; H03K 3/289
[52] U.S. Cl. ........................................... 327/203; 327/202
[58] Field of Search ................................. 327/202, 203, 327/200, 201, 208, 209, 210, 212, 218

[56] References Cited

U.S. PATENT DOCUMENTS

| | | | |
|---|---|---|---|
| 5,497,114 | 3/1996 | Shimozono et al. | 327/203 |
| 5,525,921 | 6/1996 | Callahan | 327/202 |
| 5,646,567 | 7/1997 | Felix | 327/202 |
| 5,774,003 | 6/1998 | Qureshi et al. | 327/202 |
| 6,002,284 | 12/1999 | Hill et al. | 327/202 |

*Primary Examiner*—Tuan T. Lam
*Attorney, Agent, or Firm*—Gerald E. Laws; W. James Brady, III; Frederick J. Telecky, Jr.

[57] ABSTRACT

An improved flip-flop is disclosed. The flip-flop (12) includes a latch circuit (22) that receives an input signal and a clock signal. The latch circuit (22) generates an output signal that tracks the input signal during a first portion of the clock signal, and remains constant during a second portion of the clock signal. A master flip-flop (36) receives the clock signal and the output signal of the latch circuit, and generates an output signal that tracks the output signal of the latch circuit (22) during the second portion of the clock signal, and remains constant during the first portion of the clock signal. A slave flip-flop (48) receives the clock signal and the output signal of the master flip-flop and generates an output signal. The output signal tracks the output signal of the master flip-flop (36) during the first portion of the clock signal and remains constant during the second portion of the clock signal. The flip-flop may be incorporated into a shift register (10). The flip-flop provides automatic compensation for line delays in the clock signal without the need for custom-designed delays built into the clock signal lines.

12 Claims, 1 Drawing Sheet

FLIP-FLOP

This application claims priority under 35 USC §119(e)(1) of Provisional Application No. 60/072,457, filed Jan. 9, 1998.

TECHNICAL FIELD OF THE INVENTION

This invention relates generally to the field of digital signal processing, and more particularly to an improved flip-flop.

BACKGROUND OF THE INVENTION

In the art of digital signal processing, the use of master-slave flip-flops is well known. A series of such flip-flops may be connected together in a chain to form a shift register. Typically, the flip-flops in a shift register are all controlled by single clock, so as to synchronize the operation of the flip-flops.

At a clock signal transition, each flip-flop will latch a new data bit at its input and push the previous data bit to its output. Because of propagation delay through the flip-flop, the output signal transition typically occurs after the input data bit is latched. Thus, if the flip-flops are synchronized perfectly, the output signal of one flip-flop will be latched by the next flip-flop in the chain before the output signal of the first flip-flop changes.

However, the clock signal will not reach each flip-flop at exactly the same time due to differences in the line delay to the clock inputs of the flip-flops. If the clock signal to a flip-flop is sufficiently delayed relative to the clock signal to the previous flip-flop in the chain, then data may be incorrectly transferred between the flip-flops. As a result, the input data received by the shift register will be corrupted during the shifting process.

This so-called racing problem may be eliminated by building in additional line delays as needed between the flip-flops in the shift register. However, to properly compensate for existing line delays, the additional line delays must be specifically tailored to the design of the circuit chip. This adds significantly to the burden of designing a chip.

SUMMARY OF THE INVENTION

Therefore, a need has arisen for an improved flip-flop that addresses the disadvantages and deficiencies of the prior art.

An improved flip-flop is disclosed. In one embodiment of the present invention, the flip-flop includes a latch circuit with input and output terminals which receives an input signal at the input terminal and a clock signal. The latch circuit generates an output signal at the output terminal. The output signal tracks the input signal during a first portion of the clock signal, and remains constant during a second portion of the clock signal. The flip-flop also includes a master flip-flop with an input terminal coupled to the output terminal of the latch circuit. The master flip-flop receives the clock signal and the output signal of the latch circuit, and generates an output signal at an output terminal. The output signal tracks the output signal of the latch circuit during the second portion of the clock signal, and remains constant during the first portion of the clock signal. The flip-flop also includes a slave flip-flop with an input terminal coupled to the output terminal of the of the master flip-flop. The slave flip-flop receives the clock signal and the output signal of the master flip-flop and generates an output signal. The output signal tracks the output signal of the master flip-flop during the first portion of the clock signal and remains constant during the second portion of the clock signal.

In another embodiment of the present invention, a shift register comprises a plurality of flip-flops, at least one of which is constructed according to the foregoing description. A technical advantage of the present invention is that the shift register provides automatic compensation for line delays in-the clock signal without the need for custom-designed delays built into the clock signal lines.

BRIEF DESCRIPTION OF THE DRAWINGS

For a more complete understanding of the present invention and for further features and advantages thereof, reference is now made to the following description taken in conjunction with the accompanying drawings, in which.

DETAILED DESCRIPTION OF THE INVENTION

Figure 1:
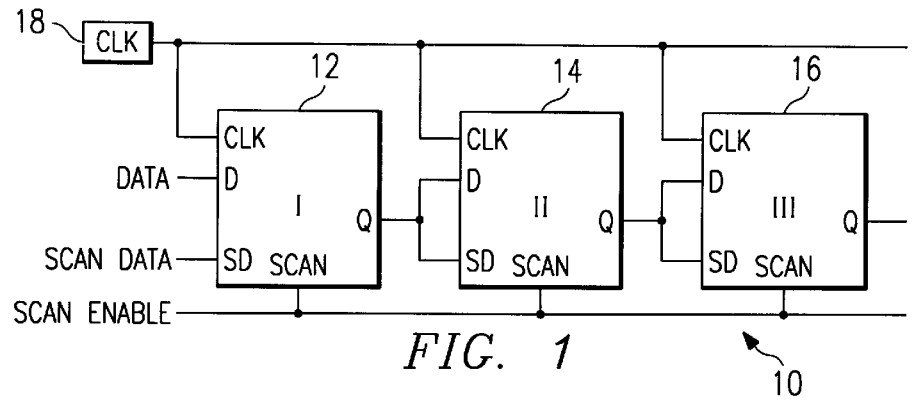
FIG. 1 is a block diagram of a shift register constructed in accordance with one embodiment of the present invention.

Referring to FIG. 1, a block diagram of a shift register 10 constructed in accordance with the present invention is shown. Shift register 10 comprises a plurality of flip-flops 12, 14 and 16. Shift register 10 may comprise, for example, eight flip-flops connected in a chain as illustrated. A clock 18 generates a clock signal to synchronize the flip-flops. Each flip-flop has clock input CLK, a data input D, a scan data input SD, a scan enable input SCAN, and an output Q.

Shift register 10 has two modes of operation: scan (test) mode and normal (data) mode. In scan mode, shift register 10 receives a predetermined scan data signal SD. This signal may be, for example, an alternating high/low signal with a period that is a multiple of the clock signal period. The output of the last flip-flop in shift register 10 is then analyzed to ensure that the scan data signal is properly passed through the shift register. In normal or data mode, an actual data signal D is received and processed by shift register 10.

The structure of shift register 10 will be described more fully below in connection with FIG. 2. The operation of shift register 10 will be described more fully below in connection with FIG. 3.

Figure 2:
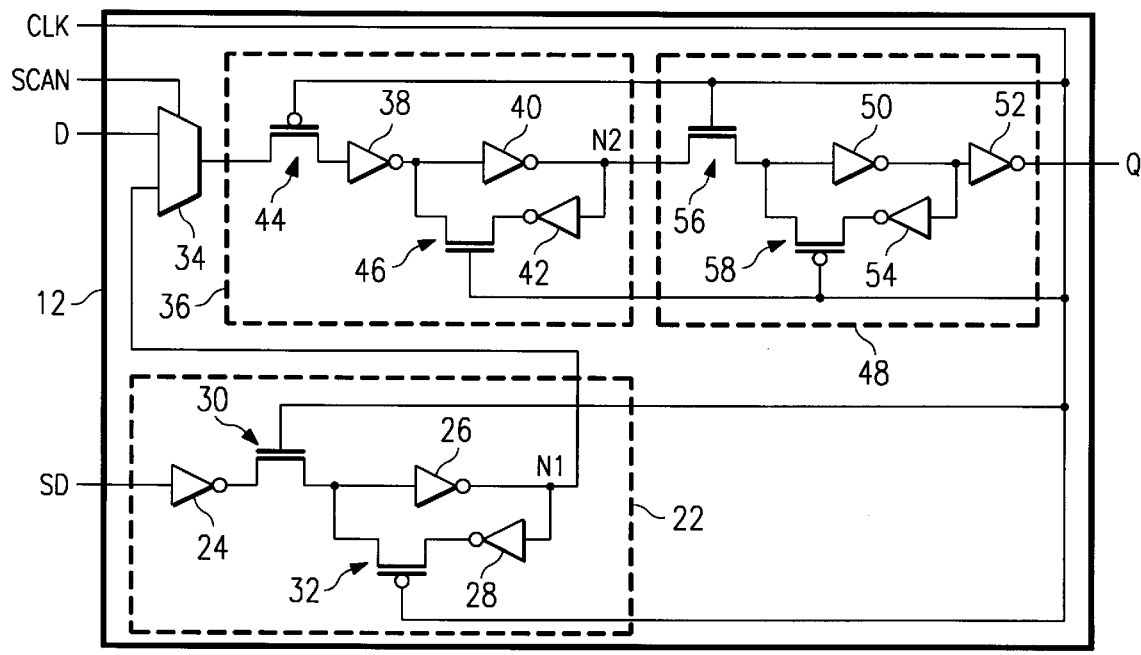
FIG. 2 is a schematic diagram of a flip-flop constructed in accordance with one embodiment of the present invention.

Referring to FIG. 2, a schematic diagram of flip-flop 12 is shown. This same design is used for all the other flip-flops 14 and 16 in shift register 10. Scan data SD is first processed by a latch circuit 22. Latch circuit 22 comprises three inverters 24, 26 and 28, two switches 30 and 32, and an output node N1. Switches 30 and 32 and other switches shown in FIG. 2 may be field effect transistors, as shown, or other well-known switching devices.

Switch 30 is open when clock signal CLK is low and closed when CLK is high. When CLK is high and switch 30 is closed, scan data signal SD is passed through inverters 24 and 26 to output node N1. When CLK is low, switch 30 opens, isolating node N1 from the scan data input signal SD. At the same time, switch 32 closes, creating a double-inverter loop with inverters 26 and 28, which holds output node N1 at its present level. Thus, output node N1 tracks SD when CLK is high, and holds when CLK is low.

Output node N1 and data input signal D are coupled to a multiplexer 34. When shift register 10 is in scan mode, scan enable signal SCAN is high, and the signal from output node N1 is output by multiplexer 34 for further processing in flip-flop 12. When shift register 10 is in normal operation mode, scan enable signal SCAN is low, and data input signal D is output by multiplexer 34 for further processing in flip-flop 12.

The output of multiplexer 34 is received by a master flip-flop 36. Master flip-flop 36, like latch circuit 22, comprises three inverters 38, 40 and 42, two switches 44 and 46, and an output node N2. Switch 44 is open when CLK is high and closed when CLK is low. Switch 46 is closed when CLK is high and open when CLK is low.

Master flip-flop 36 operates in a similar manner to latch circuit 22. Thus, output node N2 tracks the output of multiplexer 34 when CLK is low, and holds when CLK is high.

The output of master flip-flop 36 is received by a slave flip-flop 48. Slave flip-flop 48, like master flip-flop 36, comprises three inverters 50, 52 and 54, two switches 56 and 58, and an output node Q. Switch 56 is closed when CLK is high and open when CLK is low. Switch 58 is open when CLK is high and closed when CLK is low.

Slave flip-flop 48 operates in a similar manner to master flip-flop 36. Thus, output node Q tracks node N2 when CLK is high, and holds when CLK is low.

Figure 3:
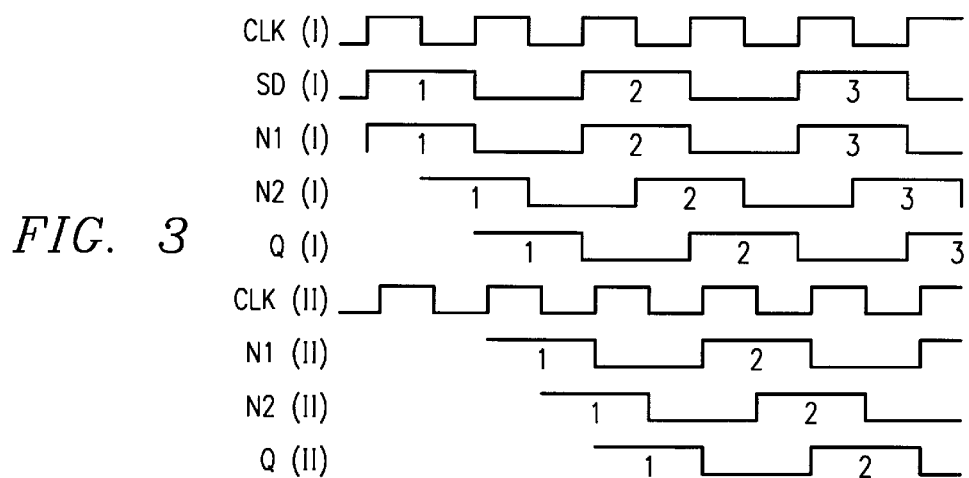
FIG. 3 is a timing diagram illustrating the operation of the shift register.

Referring to FIG. 3, a timing diagram illustrating the operation of shift register 10 in scan mode is shown. Because shift register 10 is in scan mode, the scan enable signal is high. The CLK(I) signal represents the clock input signal received at flip-flop 12. The SD(I) signal represents the scan data input signal received at flip-flop 12.

The N1(I) signal represents the potential at node N1 of flip-flop 12. N1(I) tracks SD(I) when CLK(I) is high, and remains constant when CLK(I) is low. The N2(I) signal represents the potential at node N2 of flip-flop 12. This potential tracks the potential at node N1 when CLK(I) is low, and remains constant when CLK(I) is high. The Q(I) signal represents the output signal of flip-flop 12. This signal tracks N2(I) when CLK(I) is high, and remains constant when CLK(I) is low.

The CLK(II) signal represents the clock input signal received at flip-flop 14. This signal is significantly delayed relative to the CLK(I) signal, due to delays in the clock line to flip-flop 14. The Q(I) signal is received as a scan data input signal at flip-flop 14.

The N1(II) signal represents the potential at node Ni of flip-flop 14. N1(II) tracks Q(I) when CLK(II) is high, and remains constant when CLK(II) is low. The N2(II) signal represents the potential at node N2 of flip-flop 14. This potential tracks the potential at node Ni when CLK(II) is low, and remains constant when CLK(II) is high. The Q(II) signal represents the output signal of flip-flop 14. This signal tracks N2(II) when CLK(II) is high, and remains constant when CLK(II) is low.

It will be observed that the delay or skew of CLK(II) relative to CLK(I) presents no difficulties in this case. This is because the Q(I) signal is captured at N1(II) on the falling edge of CLK(II), which comes near the center of the Q(I) bit period. If latch circuit 22 were removed from flip-flops 12 and 14, the Q(I) signal would be captured at N1(II) on the rising edge of CLK(II), resulting in capture of the wrong data bit by flip-flop 14. Shift register 10 therefore provides automatic compensation for delays in the clock signal to the flip-flops.

While the invention has been particularly shown and described by the foregoing detailed description, it will be understood by those skilled in the art that various other changes in form and detail may be made without departing from the spirit and scope of the invention.

What is claimed is:

1. A flip-flop comprising:
   a latch circuit having input and output terminals, the latch circuit being operable to receive an input signal at the input terminal and a clock signal, and operable to generate an output signal at the output terminal, the output signal tracking the input signal during a first portion of the clock signal, the output signal being constant during a second portion of the clock signal;
   a master flip-flop having an input terminal coupled to the output terminal of the latch circuit, the master flip-flop being operable to receive the clock signal and the output signal of the latch circuit, and operable to generate an output signal at an output terminal, the output signal tracking the output signal of the latch circuit during the second portion of the clock signal, the output signal being constant during the first portion of the clock signal;
   a slave flip-flop having an input terminal coupled to the output terminal of the master flip-flop, the slave flip-flop being operable to receive the clock signal and the output signal of the master flip-flop, and operable to generate an output signal tracking the output signal of the master flip-flop during the first portion of the clock signal, the output signal of the slave flip-flop being constant during the second portion of the clock signal; and
   a multiplexer operable to receive a data input signal, a mode determining signal and the output signal of the latch circuit, the multiplexer being operable to pass a selected one of the output signal of the latch circuit and that data input signal to the master flip-flop in response to the mode determining signal.

2. The flip-flop of claim 1, wherein the latch circuit further comprises:
   a first switch coupled to the input terminal of the latch circuit, the first switch being operable to receive the clock signal and the input signal, and operable to close in response to the clock signal; and
   an inverter loop having a first inverter, a second inverter, and a second switch, the first inverter having an input terminal coupled to the first switch and an output terminal coupled to the output terminal of the latch circuit, the second inverter having an input terminal coupled to the output terminal of the first inverter and an output terminal coupled to the input terminal of the first inverter, the second switch being connected between the first inverter and the second inverter, the second switch being operable to receive the clock signal and to break the inverter loop in response to the clock signal.

3. The flip-flop of claim 1, wherein the master flip-flop further comprises:
   a first switch coupled to the input terminal of the master flip-flop, the first switch being operable to receive the clock signal and the input signal, and operable to close in response to the clock signal; and
   an inverter loop having a first inverter, a second inverter, and a second switch, the first inverter having an input terminal coupled to the first switch and an output terminal coupled to the output terminal of the master flip-flop, the second inverter having an input terminal coupled to the output terminal of the first inverter and an output terminal coupled to the input terminal of the first inverter, the second switch being connected between the first inverter and the second inverter, the second switch being operable to receive the clock signal and to break the inverter loop in response to the clock signal.

4. The flip-flop of claim 1, wherein the slave flip-flop further comprises:

a first switch coupled to the input terminal of the slave flip-flop, the first switch being operable to receive the clock signal and the input signal, and operable to close in response to the clock signal; and an inverter loop having a first inverter, a second inverter, and a second switch, the first inverter having an input terminal coupled to the first switch and an output terminal coupled to the output terminal of the slave flip-flop, the second inverter having an input terminal coupled to the output terminal of the first inverter and an output terminal coupled to the input terminal of the first inverter, the second switch being connected between the first inverter and the second inverter, the second switch being operable to receive the clock signal and to break the inverter loop in response to the clock signal.

5. A shift register operable to receive an input signal and a clock signal and operable to generate an output signal, the shift register comprising:

a plurality of flip-flops connected together in a sequence, at least one of the flip-flops having a latch circuit, a master flip-flop and a slave flip-flop, the latch circuit being operable to receive the clock signal and an output signal of a previous flip-flop in the sequence, and operable to generate an output signal tracking the input signal during a first portion of the clock signal, the output signal being constant during a second portion of the clock signal, the master flip-flop being operable to receive the clock signal and the output signal of the latch circuit, and operable to generate an output signal tracking the output signal of the latch circuit during the second portion of the clock signal, the output signal being constant during the first portion of the clock signal, the slave flip-flop being operable to receive the clock signal and the output signal of the master flip-flop, and operable to generate an output signal tracking the output signal of the master flip-flop during the first portion of the clock signal, the output signal being constant during the second portion of the clock signal; and a multiplexer operable to receive a data input signal, a mode determining signal and the output signal of the latch circuit, the multiplexer being operable to pass a selected one of the output signal of the latch circuit and that data input signal to the master flip-flop in response to the mode determining signal.

6. The shift register of claim 5, wherein the latch circuit further comprises:

a first switch coupled to the input terminal of the latch circuit, the first switch being operable to receive the clock signal and the input signal, and operable to close in response to the clock signal; and an inverter loop having a first inverter, a second inverter, and a second switch, the first inverter having an input terminal coupled to the first switch and an output terminal coupled to the output terminal of the latch circuit, the second inverter having an input terminal coupled to the output terminal of the first inverter and an output terminal coupled to the input terminal of the first inverter, the second switch being connected between the first inverter and the second inverter, the second switch being operable to receive the clock signal and to break the inverter loop in response to the clock signal.

7. The shift-register of claim 5, wherein the master flip-flop further comprises:

a first switch coupled to the input terminal of the master flip-flop, the first switch being operable to receive the clock signal and the input signal, and operable to close in response to the clock signal; and an inverter loop having a first inverter, a second inverter, and a second switch, the first inverter having an input terminal coupled to the first switch and an output terminal coupled to the output terminal of the master flip-flop, the second inverter having an input terminal coupled to the output terminal of the first inverter and an output terminal coupled to the input terminal of the first inverter, the second switch being connected between the first inverter and the second inverter, the second switch being operable to receive the clock signal and to break the inverter loop in response to the clock signal.

8. The shift register of claim 5, wherein the slave flip-flop further comprises:

a first switch coupled to the input terminal of the slave flip-flop, the first switch being operable to receive the clock signal and the input signal, and operable to close in response to the clock signal; and an inverter loop having a first inverter, a second inverter, and a second switch, the first inverter having an input terminal coupled to the first switch and an output terminal coupled to the output terminal of the slave flip-flop, the second inverter having an input terminal coupled to the output terminal of the first inverter and an output terminal coupled to the input terminal of the first inverter, the second switch being connected between the first inverter and the second inverter, the second switch being operable to receive the clock signal and to break the inverter loop in response to the clock signal.

9. A shift register operable to receive an input signal and a clock signal and operable to generate an output signal, the shift register comprising:

a first flip-flop operable to receive the input signal and the clock signal, and operable to generate an output signal in response to the input signal and the clock signal;

a second flip-flop operable to receive the clock signal and the output signal of the first flip-flop, and operable to generate an output signal in response to the clock signal and the output signal of the first flip-flop, the second flip-flop having a latch circuit, a master flip-flop and a slave flip-flop, the latch circuit being operable to latch the output of the first flip-flop and generate an output signal tracking the input signal during a first portion of the clock signal, the output signal being constant during a second portion of the clock signal, the master flip-flop being operable to receive the clock signal and the output signal of the latch circuit, and operable to generate an output signal tracking the output signal of the latch circuit during the second portion of the clock signal, the output signal being constant during the first portion of the clock signal, the slave flip-flop being operable to receive the clock signal and the output signal of the master flip-flop, and operable to generate an output signal tracking the output signal of the master flip-flop during the first portion of the clock signal, the output signal being constant during the second portion of the clock signal; and a multiplexer operable to receive a data input signal, a mode determining signal and the output signal of the latch circuit, the multiplexer being operable to pass a selected one of the output signal of the latch circuit and that data input signal to the master flip-flop in response to the mode determining signal.

10. The shift register of claim 9, wherein the latch circuit further comprises:

a first switch coupled to the input terminal of the latch circuit, the first switch being operable to receive the clock signal and the input signal, and operable to close in response to the clock signal; and an inverter loop having a first inverter, a second inverter, and a second switch, the first inverter having an input terminal coupled to the first switch and an output terminal coupled to the output terminal of the latch circuit, the second inverter having an input terminal coupled to the output terminal of the first inverter and an output terminal coupled to the input terminal of the first inverter, the second switch being connected between the first inverter and the second inverter, the second switch being operable to receive the clock signal and to break the inverter loop in response to the clock signal.

11. The shift register of claim 9, wherein the master flip-flop further comprises:

a first switch coupled to the input terminal of the master flip-flop, the first switch being operable to receive the clock signal and the input signal, and operable to close in response to the clock signal; and an inverter loop having a first inverter, a second inverter, and a second switch, the first inverter having an input terminal coupled to the first switch and an output terminal coupled to the output terminal of the master flip-flop, the second inverter having an input terminal coupled to the output terminal of the first inverter and an output terminal coupled to the input terminal of the first inverter, the second switch being connected between the first inverter and the second inverter, the second switch being operable to receive the clock signal and to break the inverter loop in response to the clock signal.

12. The shift register of claim 9, wherein the slave flip-flop further comprises:

a first switch coupled to the input terminal of the slave flip-flop, the first switch being operable to receive the clock signal and the input signal, and operable to close in response to the clock signal; and an inverter loop having a first inverter, a second inverter, and a second switch, the first inverter having an input terminal coupled to the first switch and an output terminal coupled to the output terminal of the slave flip-flop, the second inverter having an input terminal coupled to the output terminal of the first inverter and an output terminal coupled to the input terminal of the first inverter, the second switch being connected between the first inverter and the second inverter, the second switch being operable to receive the clock signal and to break the inverter loop in response to the clock signal.

* * * * *